(12) United States Patent
Hosaka

(10) Patent No.: US 10,217,206 B2
(45) Date of Patent: Feb. 26, 2019

(54) INSPECTION METHOD

(71) Applicant: FUJI CORPORATION, Chiryu (JP)

(72) Inventor: Hideki Hosaka, Anjo (JP)

(73) Assignee: FUJI CORPORATION, Chiryu (JP)

( * ) Notice: Subject to any disclaimer, the term of this patent is extended or adjusted under 35 U.S.C. 154(b) by 21 days.

(21) Appl. No.: 15/320,672

(22) PCT Filed: Jul. 25, 2014

(86) PCT No.: PCT/JP2014/069660
§ 371 (c)(1),
(2) Date: Dec. 20, 2016

(87) PCT Pub. No.: WO2016/013103
PCT Pub. Date: Jan. 28, 2016

(65) Prior Publication Data
US 2017/0213332 A1 Jul. 27, 2017

(51) Int. Cl.
| | | |
|---|---|---|
| *H04N 9/47* | (2006.01) | |
| *A61B 1/04* | (2006.01) | |
| *A61B 1/06* | (2006.01) | |
| *H04N 7/18* | (2006.01) | |
| *G06T 7/00* | (2017.01) | |
| *G01D 5/30* | (2006.01) | |
| *H05K 13/04* | (2006.01) | |

(52) U.S. Cl.
CPC ............ *G06T 7/0004* (2013.01); *G01D 5/30* (2013.01); *H05K 13/0408* (2013.01); *H05K 13/0409* (2018.08)

(58) Field of Classification Search
CPC ..... G06T 7/0004; G01D 5/30; H05K 13/0408
USPC .......................................................... 348/86
See application file for complete search history.

(56) References Cited

FOREIGN PATENT DOCUMENTS

JP 2009-283952 A 12/2009

OTHER PUBLICATIONS

International Search Report dated Oct. 7, 2014 in PCT/JP14/069660 Filed Jul. 25, 2014.

*Primary Examiner* — Jared Walker
(74) *Attorney, Agent, or Firm* — Oblon, McClelland, Maier & Neustadt, L.L.P.

(57) ABSTRACT

An inspection method whereby, in a case in which a nozzle palette is imaged from above and light reflected by a reflection plate is not included in captured image data of a loading hole of the nozzle palette, it is determined that a suction nozzle is loaded in the loading hole. Meanwhile, in a case in which light reflected by the reflection plate is included in the captured image data of the loading hole, it is determined that a suction nozzle is not loaded in the loading hole. Further, in a case in which it is determined that a suction nozzle is loaded in the loading hole, air is ejected toward the loading hole. Then, it is redetermined whether reflected light reflected by the reflection plate is included in the captured image data of the loading hole.

5 Claims, 6 Drawing Sheets

INSPECTION METHOD

TECHNICAL FIELD

The present application relates to an inspection method that inspects whether a suction nozzle is stored in a nozzle storage section.

BACKGROUND ART

In an electronic component mounting machine that mounts electronic components onto a circuit board, since suction nozzles corresponding to the shapes, sizes, and the like of the electronic components are used, many suction nozzles are necessary. Therefore, a nozzle palette or the like that is capable of storing the suction nozzles is used, and the suction nozzles are managed in a state of being stored in the nozzle palette. In this case, it is necessary to detect the storage location of the suction nozzle in the nozzle palette or the like. Therefore, inspection is performed to determine whether a suction nozzle is stored in a nozzle storage section of the nozzle palette or the like. In the patent literature described below, a method is described in which reflected light is used to inspect whether a suction nozzle is stored in a nozzle storage section.

CITATION LIST

Patent Literature

PTL 1: JP-A-2009-283952

SUMMARY

According to the inspection method described in the above patent literature, to a certain degree, it is possible to determine whether a suction nozzle is stored in a nozzle storage section. However, in a case in which foreign matter such as water droplets or dust are adhered to the periphery of the nozzle storage section, the reflected light may not reflect in an appropriate direction due to the foreign matter. In such a case, even if a suction nozzle is not stored in the nozzle storage section, there is a concern that it will be erroneously determined that a suction nozzle is stored in the nozzle storage section. The present disclosure is made in consideration of such issues, and an object of the present disclosure is to appropriately determine whether a suction nozzle is stored in a nozzle storage section.

In order to solve the problem described above, an inspection method according to an aspect of the present application is an inspection method for inspecting whether a suction nozzle is stored in a nozzle storage section, the inspection method including a determination step of determining whether a suction nozzle is stored in the nozzle storage section, an air ejecting step of ejecting air toward the nozzle storage section in a case in which it is determined that a suction nozzle is stored in the nozzle storage section by the determination step, and a redetermination step of determining whether a suction nozzle is stored in the nozzle storage section after ejecting air in the air ejecting step.

According to another aspect, each of the determination step and the redetermination step is a step of imaging the nozzle storage section and determining whether a suction nozzle is stored in the nozzle storage section based on captured image data which is obtained through the imaging.

According to another aspect, the nozzle storage section includes a through-hole that penetrates in a vertical direction and is blocked by a suction nozzle when the suction nozzle is housed, a reflection member is provided under the through-hole, and each of the determination step and the redetermination step determines that a suction nozzle is stored in the nozzle storage section in a case in which reflected light reflected by the reflection member is not included in captured image data obtained through the imaging, and determines that a suction nozzle is not stored in the nozzle storage section in a case in which reflected light reflected by the reflection member is included in captured image data obtained through the imaging.

According to another aspect, each of the determination step and the redetermination step is a step of determining that a suction nozzle is stored in the nozzle storage section in a case in which an identification mark that is depicted on the suction nozzle is included in captured image data obtained through the imaging, and determining that a suction nozzle is not stored in the nozzle storage section in a case in which the identification mark is not included in captured image data obtained through the imaging.

Advantageous Effects

In the inspection method according to Claim 1 of the present application, in a case in which it is determined that a suction nozzle is stored in the nozzle storage section, air is ejected toward the storage unit. After the air is ejected, whether the suction nozzle is stored in the nozzle storage section is redetermined. In other words, after the foreign matter that is a cause of erroneous determination is blown away by the air, whether the suction nozzle is stored in the nozzle storage section is redetermined. Accordingly, it is possible to appropriately determine whether the suction nozzle is stored in the nozzle storage section.

In the inspection method according to Claim 2 of the present application, the nozzle storage section is imaged, and whether the suction nozzle is stored in the nozzle storage section is determined based on captured image data obtained through the imaging. Accordingly, it is possible to favorably determine whether the suction nozzle is stored in the nozzle storage section.

In the inspection method according to Claim 3 of the present application, the nozzle storage section is penetrated in the vertical direction, and a reflection member is provided under the nozzle storage section. In a case in which the reflected light reflected by the reflection member is not included in the captured image data obtained through the imaging of the nozzle storage section, it is determined that a suction nozzle is stored in the nozzle storage section. Meanwhile, in a case in which the reflected light reflected by the reflection member is included in the captured image data, it is determined that a suction nozzle is not stored in the nozzle storage section. When determination is performed in this manner, in a case in which foreign matter is adhered to the reflection member, the reflected light is not reflected properly due to the foreign matter, and erroneous determination occurs easily. Therefore, in the inspection method according to the present application, an effect of blowing away the foreign matter using the ejection of air is sufficiently employed.

In the inspection method according to Claim 4 of the present application, in a case in which the identification mark which is depicted on the suction nozzle is included in the captured image data obtained through the imaging of the nozzle storage section, it is determined that a suction nozzle is stored in the nozzle storage section. Meanwhile, in a case in which the identification mark is not included in the captured image data, it is determined that a suction nozzle is not stored in the nozzle storage section. When determination is performed in this manner, in a case in which foreign matter is adhered to the identification mark, the identification mark may not be appropriately read, and erroneous determination occurs easily. Therefore, in the inspection method according to the present application, an effect of blowing away the foreign matter using the ejection of air is sufficiently employed.

DESCRIPTION

Figure 1:
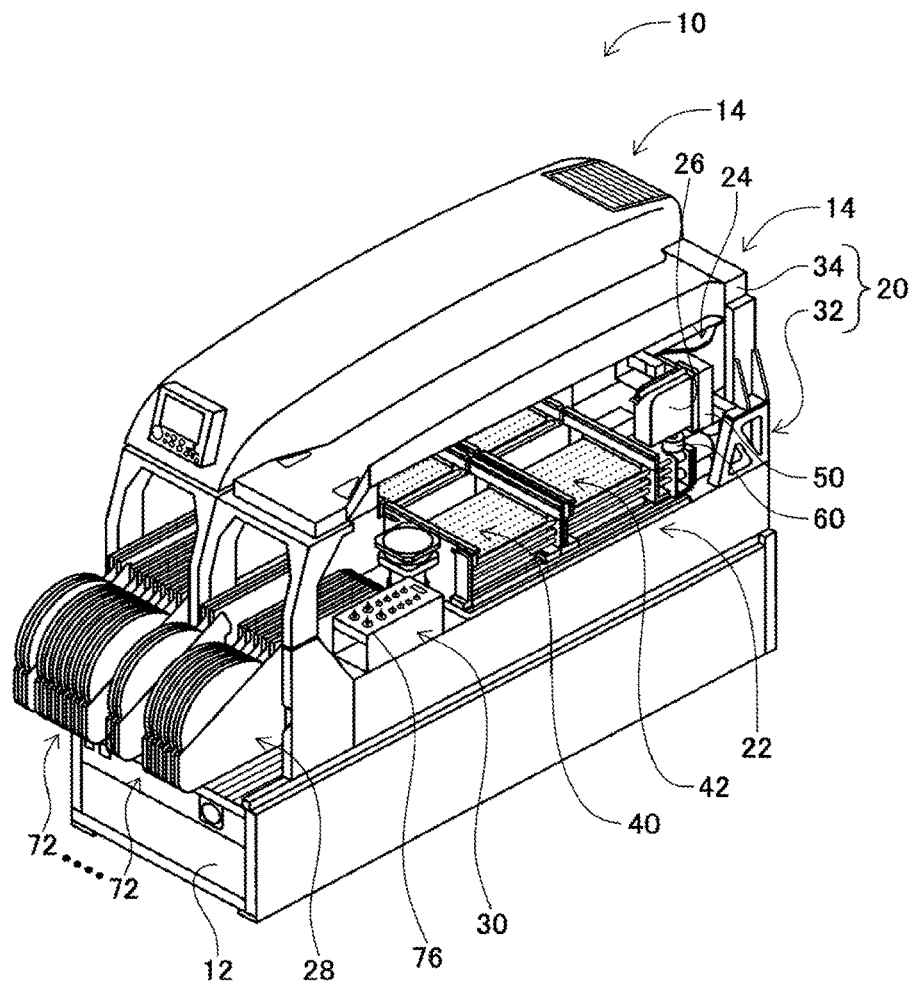
FIG. 1 is a perspective view illustrating an electronic component mounting device.

Hereinafter, detailed description will be given of an embodiment of the present disclosure with reference to the drawings as a mode for carrying out the present disclosure.
Configuration of Electronic Component Mounting Device FIG. 1 illustrates an electronic component mounting device (hereinafter there are cases in which this is shortened to "mounting device") 10. Mounting device 10 includes a single system base 12, and two electronic component mounting machines (hereinafter, there are cases in which this is shortened to "mounting machines") 14 that are adjacent on the system base 12. The direction in which mounting machines 14 are lined up will be referred to as an X-axis direction, and a horizontal direction which is perpendicular to the X-axis direction will be referred to as a Y-axis direction.

Each of the mounting machines 14 is mainly provided with mounting machine main body 20, conveyance device 22, mounting head moving device (hereinafter, there are cases in which this is shortened to a "moving device") 24, mounting head 26, supply device 28, and nozzle station 30. Mounting machine main body 20 is formed of frame section 32, and beam section 34 that bridges over frame section 32.

Conveyance device 22 is provided with two conveyor devices 40 and 42. The two conveyor devices 40 and 42 are installed on frame section 32 to be parallel to each other and to extend in the X-axis direction. The two conveyor devices 40 and 42 convey circuit boards that are supported by the conveyor devices 40 and 42 in the X-axis direction using an electromagnetic motor (not illustrated). The circuit board is held in a fixed manner at a predetermined position by a board holding device (not illustrated).

Moving device 24 is an XY robot-type moving device. Moving device 24 is provided with an electromagnetic motor (not illustrated) which causes slider 50 to slide in the X-axis direction, and an electromagnetic motor (not illustrated) which causes slider 50 to slide in the Y-axis direction. Mounting head 26 is attached to slider 50, and mounting head 26 is caused to move to any position above frame section 32 by the operation of the two electromagnetic motors.

Figure 2:
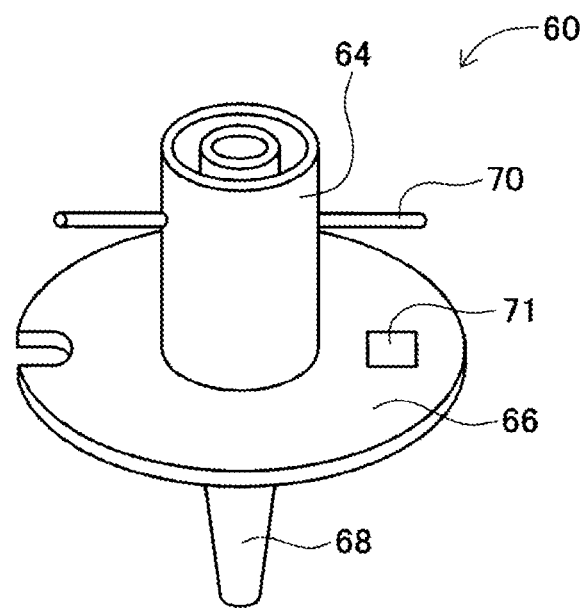
FIG. 2 is a perspective view illustrating a suction nozzle.

Mounting head 26 mounts the electronic component onto the circuit board. Suction nozzle 60 is provided on the bottom end surface of mounting head 26. As illustrated in FIG. 2, suction nozzle 60 is formed of body cylinder 64, flange section 66, suction pipe 68, and locking pin 70. Body cylinder 64 is cylindrically shaped, and flange section 66 is fixed to protrude from the outer circumferential surface of body cylinder 64. 2D code 71 is depicted on the upper surface of flange section 66. 2D code 71 is an identification mark for identifying unique information of suction nozzle 60. Suction pipe 68 is a narrow pipe, and is held by body cylinder 64 to be capable of moving in an axial line direction in a state extending downward from the bottom end portion of body cylinder 64. Locking pin 70 is provided on the top end portion of body cylinder 64 so as to extend in the radial direction of body cylinder 64. Suction nozzle 60 is attached in a single operation to mounting head 26, being attached and detached using locking pin 70.

Suction nozzle 60 is connected to a positive and negative pressure supply device (not illustrated) via negative pressure air and positive pressure air passages. Each of the suction nozzles 60 vacuum holds the electronic component using negative pressure and releases the held electronic component using positive pressure. Mounting head 26 includes a nozzle lifting and lowering device (not illustrated) that lifts and lowers suction nozzle 60. Mounting head 26 changes the position of the held electronic component in the vertical direction using the nozzle lifting and lowering device.

Supply device 28 is a feeder-type supply device and, as illustrated in FIG. 1, is installed on the end portion of the front side of frame section 32. Supply device 28 includes tape feeders 72. Tape feeder 72 houses taped components in a wound state. The taped components are obtained by taping the electronic components. Tape feeder 72 feeds out the taped components using a feed device (not illustrated). Accordingly, feeder-type supply device 28 supplies the electronic components to the supplying position by feeding out the taped components.

Nozzle station 30 includes nozzle tray 76 that houses multiple suction nozzles 60. In nozzle station 30, the exchanging of a suction nozzle 60 attached to mounting head 26 with a suction nozzle 60 housed in nozzle tray 76, and the like is performed as necessary. Nozzle tray 76 is capable of being attached and detached in relation to nozzle station 30 such that the collection of suction nozzles 60 housed in the nozzle tray 76, refilling of suction nozzles 60 to the nozzle tray 76, and the like can be performed outside of mounting machines 14.

Mounting Work by Mounting Machine

According to the configuration described above, in mounting machine 14, it is possible to perform mounting work on a circuit board held by conveyance device 22 using mounting head 26. Specifically, according to instructions of a control device (not illustrated) of mounting machine 14, the circuit board is conveyed to a working position, and at this position, is held in a fixed manner by the board holding device. Tape feeder 72 feeds out the taped components and supplies the electronic components to the supplying position according to instructions of the control device. Mounting head 26 moves above the supplying position of the electronic components and vacuum holds the electronic component using suction nozzle 60. Subsequently, mounting head 26 moves above the circuit board, and the electronic component being held is mounted onto the circuit board.

As described above, in the mounting machine 14, an electronic component supplied by tape feeder 72 is vacuum held by suction nozzle 60, and the electronic component is mounted onto the circuit board. In this case, there is a case in which foreign matter such as solder is adhered to suction nozzle 60, and appropriate mounting work may not be performed by a suction nozzle 60 to which foreign matter is adhered. In consideration of this, nozzle tray 76 is detached from nozzle station 30 of mounting machine 14, and cleaning of suction nozzles 60 housed in nozzle tray 76 is performed in a nozzle management device. Hereinafter, detailed description will be given of the nozzle management device.

Configuration of Nozzle Management Device

Figure 3:
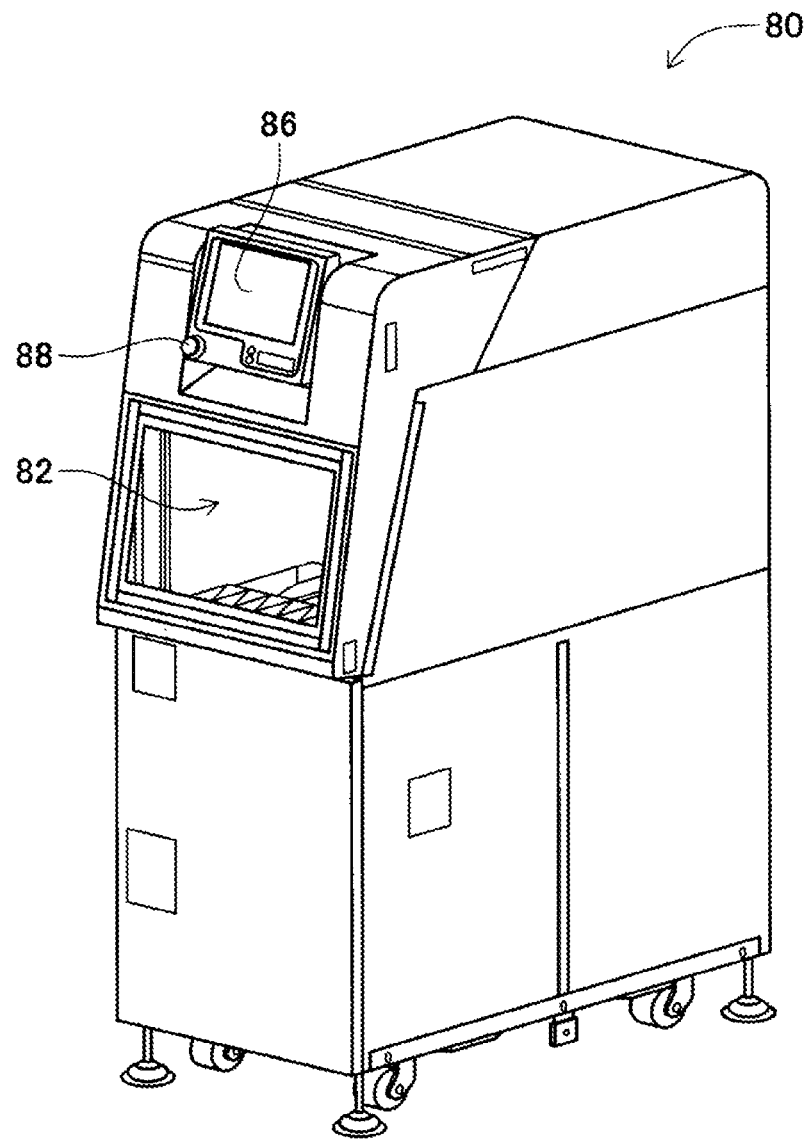
FIG. 3 is a perspective view illustrating a nozzle management device.

As illustrated in FIG. 3, nozzle management device 80 is a substantially rectangular parallelepiped shape, and door 82 for storing nozzle tray 76 inside nozzle management device 80 and for removing nozzle tray 76 from nozzle management device 80 is provided in the front surface. Panel 86 that displays various information, operation switch 88 for performing the input of information and the like, and the like are installed above door 82.

Figure 4:
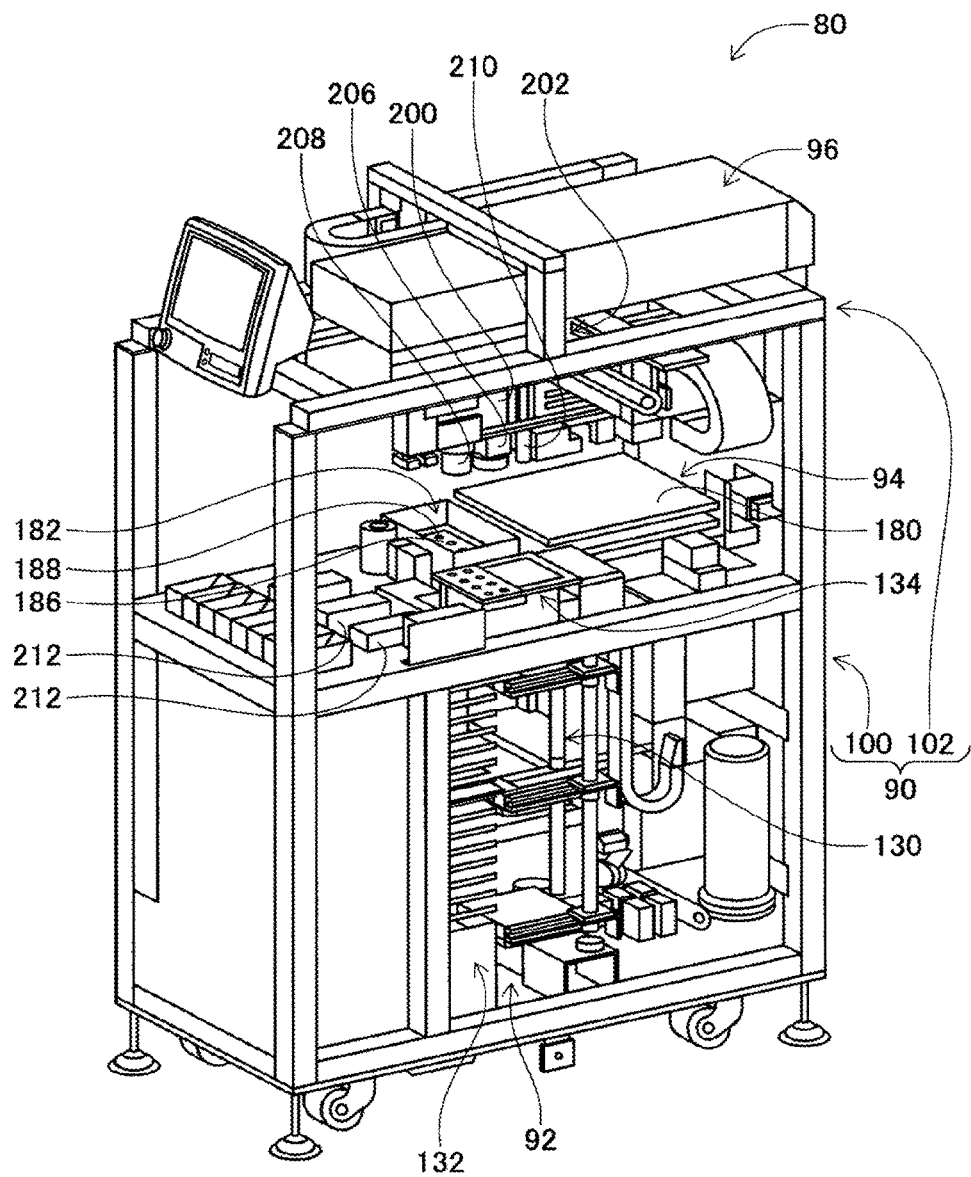
FIG. 4 is a perspective view illustrating the internal structure of the nozzle management device.

As illustrated in FIG. 4, nozzle management device 80 includes management device main body 90, palette accommodation device 92, nozzle cleaning device 94, and nozzle transfer device 96. FIG. 4 is a perspective view illustrating a state in which an outer shell member of nozzle management device 80 is removed, and illustrates the internal structure of nozzle management device 80.

(a) Management Device Main Body

Management device main body 90 is configured to include frame section 100, and beam section 102 that is bridged over frame section 100. Frame section 100 has a hollow structure, and palette housing device 92 is installed in the inner portion of frame section 100 in a state in which the top end portion of palette accommodation device 92 is exposed to the upper surface of frame section 100.

(b) Palette Accommodation Device

Figure 5:
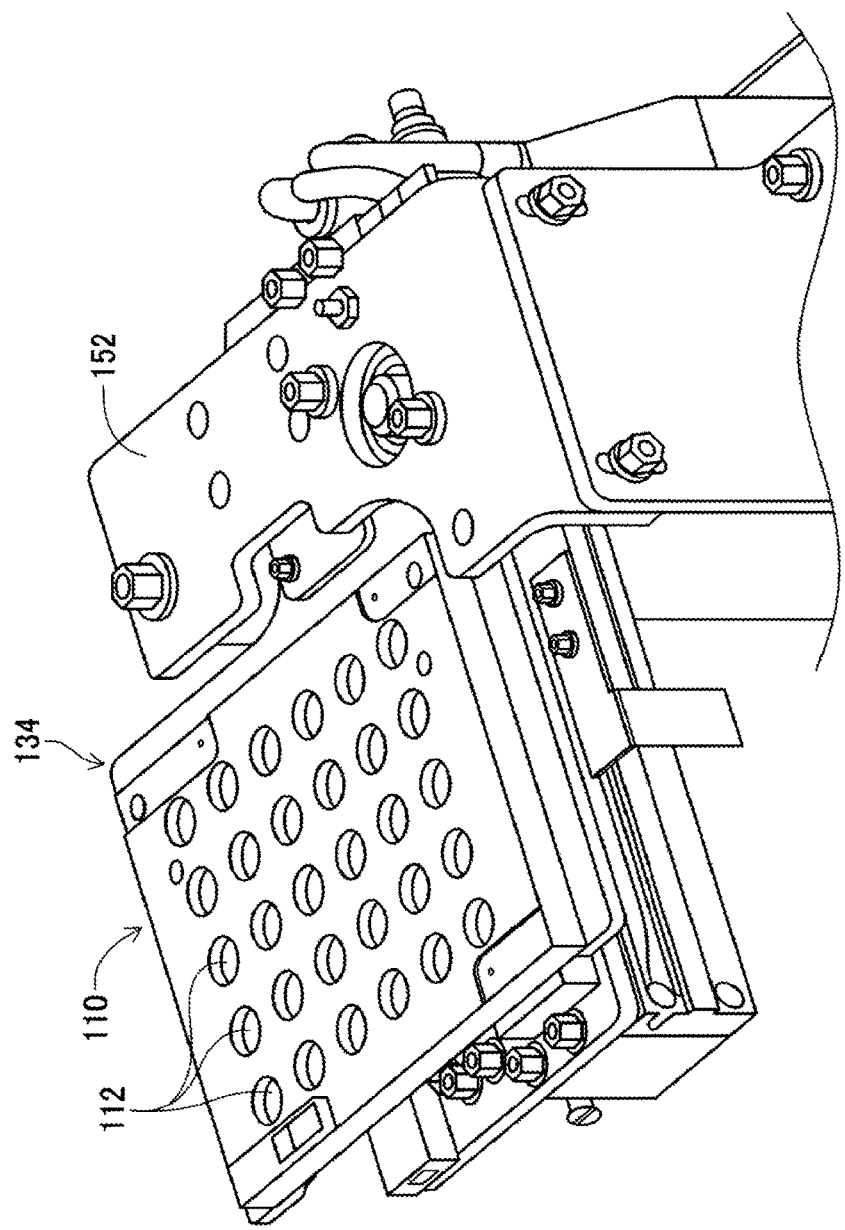
FIG. 5 is a perspective view illustrating a palette moving device on which a nozzle palette is placed.
Figure 6:
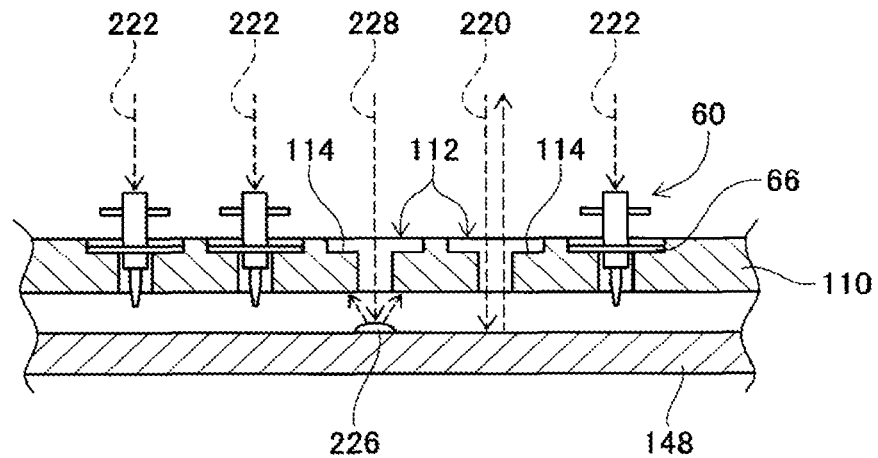
FIG. 6 is a sectional diagram illustrating the nozzle palette which is supported by a support arm.

Palette accommodation device 92 houses nozzle palette 110, which is illustrated in FIG. 5. Multiple loading holes 112 are formed in nozzle palette 110. As illustrated in FIG. 6, loading hole 112 is a through-hole with a stepped shape and it is possible to place a suction nozzle 60 therein. Specifically, the inner diameter of step surface 114 of loading hole 112 with the stepped shape is slightly larger than the outer diameter of flange section 66 of suction nozzle 60, and flange section 66 of suction nozzle 60 is placed on step surface 114.

Figure 7:
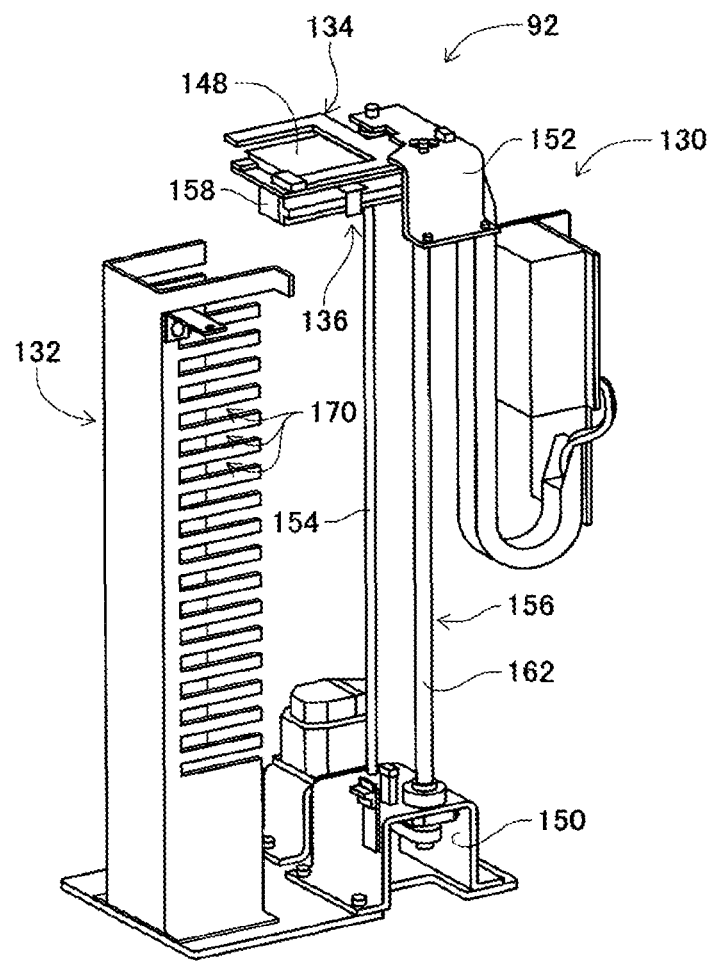
FIG. 7 is a perspective view illustrating a palette accommodation device.

Palette accommodation device 92 houses nozzle palette 110 of the structure described above. As illustrated in FIG. 7, palette accommodation device 92 includes palette moving device 130 and palette accommodation tower 132, and palette moving device 130 and palette accommodation tower 132 are installed to face each other.

Palette moving device 130 is configured to include support arm 134 and arm moving mechanism 136. Support arm 134 is formed in a substantially C-shape, and the distal end portions of the open side function as tip portions. In other words, the distal end section of support arm 134 extends out into a fork. The interval of the distal end sections that extend out in a fork of support arm 134 is smaller than the width of nozzle palette 110. Therefore, as illustrated in FIG. 5, nozzle palette 110 is placed on the upper surface of support arm 134. As illustrated in FIG. 7, reflection plate 148 is attached to the bottom surface side of support arm 134.

Arm moving mechanism 136 includes base 150, upper cover 152, guide rail 154, screw mechanism 156, and slider 158. Guide rail 154 is installed to extend in the vertical direction, and is fixed to base 150 at the bottom end portion. Upper cover 152 is fixed to the top end portion of guide rail 154. Screw mechanism 156 is configured to include screw rod 162 and a nut (not illustrated). A male screw (not illustrated) is formed on the outer circumferential surface of screw rod 162, and screw rod 162 is installed parallel to guide rail 154 so as to extend in the vertical direction. Rod 162 is held by base 150 and upper cover 152 to be capable of rotating around an axial center of rod 162. Screw rod 162 rotates around the axial center in a controllable manner by the driving of an electromagnetic motor (not illustrated).

Meanwhile, the nut screws onto the male screw formed on the outer circumferential surface of screw rod 162, and is fixed to slider 158. A through-hole (not illustrated) that penetrates in the vertical direction is formed in slider 158. Guide rail 154 is inserted through the through-hole, and slider 158 moves along guide rail 154. According to this structure, slider 158 slides on guide rail 154 to move to any position in the vertical direction due to the rotation of screw rod 162 caused by the driving of the electromagnetic motor. The top end portion of palette moving device 130 is exposed to the upper surface of frame section 100. Therefore, due to the operation of screw mechanism 156, in a case in which support arm 134 is lifted to the highest position, as illustrated in FIG. 4, support arm 134 is exposed to the upper surface of frame section 100. In other words, nozzle palette 110 supported by support arm 134 is exposed to the upper surface of frame section 100.

As illustrated in FIG. 7, support arm 134 is installed on the upper surface of slider 158 to be capable of sliding in the forward-backward direction. Accordingly, support arm 134 approaches and separates with respect to palette accommodation tower 132. Support arm 134 slides to any position due to the driving of the electromagnetic motor (not illustrated).

Multiple palette storage sections 170 are formed on palette accommodation tower 132. The multiple palette storage sections 170 are installed lined up in the vertical direction, and a nozzle palette 110 is housed in each of palette storage sections 170.

(c) Nozzle Cleaning Device

Nozzle cleaning device 94 performs cleaning and drying of suction nozzle 60, and as illustrated in FIG. 4, is installed on the upper surface of frame section 100. Nozzle cleaning device 94 is provided with cleaning and drying mechanism 180 and cleaning palette moving mechanism 182. Cleaning and drying mechanism 180 is a mechanism inside which the cleaning and drying of suction nozzle 60 is performed. Cleaning palette moving mechanism 182 is a mechanism that causes cleaning palette 186 to move between an exposure position in which cleaning palette 186 is exposed (the position in which cleaning palette 186 is illustrated in FIG. 4), and a position inside of cleaning and drying mechanism 180. Multiple loading holes 188 of the same shape as loading holes 112 of nozzle palette 110 are formed in cleaning palette 186, such that it is possible to load suction nozzles 60 on cleaning palette 186.

(d) Nozzle Transfer Device

Nozzle transfer device 96 is a device for transferring suction nozzles 60, and is installed on beam section 102. Nozzle transfer device 96 includes transfer head 200 and head moving device 202. Camera 206 in a downward facing state, holding chuck 208 for holding suction nozzle 60, and air ejector 210 that ejects air downward are attached to the bottom end surface of transfer head 200. Head moving device 202 is an XYZ type moving device that causes transfer head 200 to move in the forward-backward direction, the horizontal direction, and the vertical direction above frame section 100.

Fixed stage 212 for setting nozzle tray 76 is provided on the upper surface of frame section 100, and suction nozzle 60 is transferred between nozzle tray 76 set in fixing stage 212, nozzle palette 110 supported by support arm 134, and cleaning palette 186 positioned at the exposure position.

(e) Management of Suction Nozzle in Nozzle Management Device

In nozzle management device 80 of the structure described above, the cleaning of suction nozzle 60 is performed, and the cleaned suction nozzle 60 is stored in palette accommodation tower 132. Specifically, an operator sets nozzle tray 76 on which a suction nozzle 60 is placed on fixing stage 212. Holding chuck 208 of nozzle transfer device 96 moves above nozzle tray 76 due to the operation of head moving device 202, and the suction nozzle 60 placed on nozzle tray 76 is held by holding chuck 208.

When suction nozzle 60 is held by holding chuck 208, holding chuck 208 moves above the exposure position of cleaning palette moving mechanism 182 due to the operation of head moving device 202. In this case, in cleaning palette moving mechanism 182, cleaning palette 186 moves to the exposure position due to the operation of cleaning palette moving mechanism 182. Holding chuck 208 moves downward, and suction nozzle 60 is loaded on cleaning palette 186. When the loading of suction nozzle 60 onto cleaning palette 186 is completed, cleaning palette 186 moves into the inner portion of cleaning and drying mechanism 180 due to the operation of cleaning palette moving mechanism 182. The cleaning and the drying of suction nozzle 60 is performed in the inner portion of cleaning and drying mechanism 180.

When the cleaning and the drying of suction nozzle 60 by cleaning and drying mechanism 180 is completed, cleaning palette 186 moves to the exposure position due to the operation of cleaning palette moving mechanism 182. Holding chuck 208 moves above cleaning palette 186 due to the operation of head moving device 202, and the cleaned suction nozzle 60 is held by holding chuck 208. Subsequently, holding chuck 208 moves above palette moving device 130 due to the operation of head moving device 202. In this case, in palette moving device 130, support arm 134 that supports nozzle palette 110 moves to the highest position due to the operation of screw mechanism 156.

In order to load the suction nozzle 60 that is held by holding chuck 208 in loading hole 112 of nozzle palette 110, the detection of a loading hole 112 in which a suction nozzle 60 is not loaded is performed. In other words, it is determined whether a suction nozzle 60 is already loaded in the loading hole 112 of the nozzle palette 110. Specifically, as described above, reflection plate 148 is installed under support arm 134 that supports nozzle palette 110. Loading holes 112 of nozzle palette 110 penetrate nozzle palette 110. Therefore, as illustrated in FIG. 6, in a case in which a suction nozzle 60 is not loaded in a loading hole 112 of nozzle palette 110, emitted light 220 emitted from above nozzle palette 110 is reflected by reflection plate 148 via the loading hole 112. Meanwhile, in a case in which a suction nozzle 60 is loaded in the loading hole 112, an emitted light 222 emitted from above nozzle palette 110 is blocked by the suction nozzle 60 and is not reflected by reflection plate 148. Therefore, in a case in which nozzle palette 110 supported by support arm 134 is imaged by camera 206 from above and the reflected light is included in the captured image data of the loading hole 112 of nozzle palette 110, it is possible to determine that a suction nozzle 60 is not loaded in the loading hole 112. Meanwhile, in a case in which the reflected light is not included in the captured image data of the loading hole 112, it is possible to determine that a suction nozzle 60 is loaded in the loading hole 112.

However, a suction nozzle 60 that is loaded on nozzle palette 110 is dried after cleaning in cleaning and drying mechanism 180, and since the drying of the suction nozzle 60 is performed in a state in which the suction nozzle 60 is loaded on cleaning palette 186 inside cleaning and drying mechanism 180, there is a concern that water is adhered to the suction nozzle 60. Therefore, there is a concern that water adhered to the suction nozzle 60 may fall onto nozzle palette 110, and that a fallen water droplet may adhere to reflection plate 148, such that it may not be possible to appropriately determine whether the suction nozzle 60 is loaded in the loading hole 112 due to the water droplet.

Specifically, as illustrated in FIG. 6, water droplet 226 is adhered to reflection plate 148, and when light from above nozzle palette 110 is emitted toward the water droplet, there is a case in which emitted light 228 is refracted by water droplet 226 and is not reflected in a specular manner. In such a case, even if the suction nozzle 60 is not loaded in the loading hole 112 of nozzle palette 110, the reflected light is not included in the captured image data of the loading hole 112. In other words, in a case in which a suction nozzle 60 is not loaded in the loading hole 112 of nozzle palette 110, it is erroneously determined that a suction nozzle 60 is loaded in the loading hole 112.

In consideration of this fact, in a case in which it is determined that a suction nozzle 60 is loaded in the loading hole 112 based on the captured image data of the loading hole 112, after air is ejected toward the loading hole 112 by air ejector 210, whether a suction nozzle 60 is loaded in the loading hole 112 is redetermined. Specifically, in a case in which it is determined that a suction nozzle 60 is loaded in the loading hole 112 based on the captured image data of the loading hole 112, air ejector 210 moves above the loading hole 112 that is the determination target through the operation of head moving device 202. Subsequently, air is ejected toward the loading hole 112 that is the determination target by air ejector 210. Nozzle palette 110 is imaged again by camera 206, and whether a suction nozzle 60 is loaded in the loading hole 112 is redetermined based on the captured image data. In other words, whether a suction nozzle 60 is loaded in the loading hole 112 is redetermined after the water droplet 226 that was the cause of erroneous determination is blown away. Accordingly, it becomes possible to appropriately determine whether a suction nozzle 60 is loaded in the loading hole 112.

After determining whether a suction nozzle 60 is loaded in the loading hole 112 according to the procedure described above, holding chuck 208 that holds a suction nozzle 60 moves, due to the operation of a head moving device 202, above the loading hole 112 in which it has been determined that a suction nozzle 60 is not loaded, and the suction nozzle 60 is loaded in the loading hole 112. When the loading of the suction nozzle 60 on nozzle palette 110 is completed, support arm 134 that supports nozzle palette 110 is lowered through the operation of screw mechanism 156. In this case, support arm 134 is lowered such that nozzle palette 110 supported by support arm 134 faces the palette storage section 170 that is the storage target. Support arm 134 moves in a direction approaching palette accommodation tower 132. Accordingly, the nozzle palette 110 supported by support arm 134 is housed in the palette storage section 170 that is the storage target.

Suction nozzle 60 is an example of a suction nozzle. 2D code 71 is an example of an identification mark. Loading hole 112 is an example of a nozzle storage section. Reflection plate 148 is an example of a reflection member. The step of determining whether a suction nozzle 60 is loaded in the loading hole 112 based on the captured image data captured by camera 206 is an example of a determination step. The step of ejecting air toward the loading hole 112 using air ejector 210 after it is determined that the suction nozzle 60 is not loaded in the loading hole 112 is an example of an air ejecting step. The step of redetermining whether a suction nozzle 60 is loaded in the loading hole 112 based on the captured image data captured by camera 206 after ejecting air toward the loading hole 112 is an example of a redetermination step.

The present disclosure is not limited to the embodiment described above, and it is possible to carry out the present disclosure in various modes subjected to various modifications and improvements based on the knowledge of a person skilled in the art. Specifically, for example, in the embodiment described above, whether a suction nozzle 60 is loaded in the loading hole 112 is determined using reflected light that is reflected by reflection plate 148; however, it is possible to determine whether a suction nozzle 60 is loaded in the loading hole 112 using an identification mark depicted on the suction nozzle 60.

Specifically, the loading hole 112 of nozzle palette 110 may be imaged using camera 206, and it may be determined whether data relating to 2D code 71 of the suction nozzle 60 is included in the captured image data. In a case in which data relating to the 2D code 71 of the suction nozzle 60 is included in the captured image data, it is determined that a suction nozzle 60 is loaded in the loading hole 112, and in a case in which data relating to 2D code 71 of the suction nozzle 60 is not included in the captured image data, it is determined that a suction nozzle 60 is not loaded in the loading hole 112. In this case, in a case in which it is determined that a suction nozzle 60 is not loaded in the loading hole 112, air is ejected toward the loading hole 112 by air ejector 210. After the ejection of air, the loading hole 112 of nozzle palette 110 is imaged using camera 206, and it is determined whether data relating to the 2D code 71 of the suction nozzle 60 is included in the captured image data. Accordingly, after dust, a water droplet, or the like that is a cause of erroneous determination is blown away, it becomes possible to appropriately determine whether a suction nozzle 60 is loaded in the loading hole 112.

In the example described above, whether a suction nozzle 60 is loaded in the placement hole 112 is determined using the captured image data captured by camera 206; however, it is possible to determine whether a suction nozzle 60 is loaded in the loading hole 112 using a sensor of an optical system. Specifically, for example, in a case in which the distance between the arrangement position of the sensor and the loading hole 112 is measured using a distance sensor, the measured distance of a case in which a suction nozzle 60 is loaded in the loading hole 112 is shorter than the measured distance of a case in which a suction nozzle 60 is not loaded in the loading hole 112. Using this fact, it is possible to determine whether a suction nozzle 60 is loaded in the loading hole 112.

In the embodiment described above, whether a suction nozzle 60 is loaded on nozzle palette 110 is inspected in nozzle management device 80; however, it is possible to inspect whether a suction nozzle 60 is loaded on nozzle tray 76 in mounting machine 14.

REFERENCE SIGNS LIST

60: suction nozzle, 71: 2D code (identification mark), 112: loading hole (nozzle storage section), 148: reflection plate (reflection member)

The invention claimed is:

1. An inspection method for inspecting whether a suction nozzle is stored in a nozzle storage section, the inspection method comprising: a determination step of determining whether a suction nozzle is stored in the nozzle storage section; an air ejecting step of ejecting air toward the storage section such that any foreign matter is blown away in a case in which it is determined that a suction nozzle is stored in the nozzle storage section by the determination step; a redetermination step of determining whether a suction nozzle is stored in the nozzle storage section after ejecting air in the air ejecting step in response to the determination step determining that a suction nozzle is stored in the nozzle storage section; and placing a suction nozzle in the nozzle storage section when the redetermination step determines that a suction nozzle is not stored in the nozzle storage section.

2. The inspection method according to claim 1,
wherein each of the determination step and the redetermination step is a step of imaging the nozzle storage section and determining whether a suction nozzle is stored in the nozzle storage section based on captured image data obtained through the imaging.

3. The inspection method according to claim 2,
wherein the nozzle storage section includes a through-hole that penetrates in a vertical direction and is blocked by a suction nozzle when the suction nozzle is housed,
wherein a reflection member is provided under the through-hole, and
wherein each of the determination step and the redetermination step determines that a suction nozzle is stored in the nozzle storage section in a case in which reflected light reflected by the reflection member is not included in captured image data obtained through the imaging, and determines that a suction nozzle is not stored in the nozzle storage section in a case in which reflected light reflected by the reflection member is included in captured image data obtained through the imaging.

4. The inspection method according to claim 2,
wherein each of the determination step and the redetermination step is a step of determining that a suction nozzle is stored in the nozzle storage section in a case in which an identification mark that is depicted on the suction nozzle is included in captured image data obtained through the imaging, and determining that a suction nozzle is not stored in the nozzle storage section in a case in which the identification mark is not included in captured image data obtained through the imaging.

5. A nozzle management device comprising: a head to which a suction nozzle is attached, the suction nozzle being configured to pick up and mount a component on a board nozzle by being supplied with negative and positive pressure; a storage section configured to store spare suction nozzles that are not attached to the head; an inspection device including a determination section configured to determine whether one of the spare suction nozzles is stored in the storage section; and a control section configured to supply positive pressure to the suction nozzle attached to the head to eject air toward the storage section such that any foreign matter is blown away when the determination section determines that one of the spare suction nozzles is stored in the nozzle storage section, wherein the inspection device further includes a redetermination section configured to determine whether the one of the spare suction nozzles is actually stored in the storage section after the air has been ejected toward the storage section by the suction nozzle attached to the head in response to the determination section determining that one of the spare suction nozzles is stored in the nozzle storage section, and wherein the control section is further configured to place a suction nozzle in the storage section when the redetermination section determines that one of the spare suction nozzles is not actually stored in the storage section.

* * * * *